United States Patent
Hashimoto

(10) Patent No.: US 7,175,462 B2
(45) Date of Patent: Feb. 13, 2007

(54) PGA TYPE IC SOCKET

(75) Inventor: Shinichi Hashimoto, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 0 days.

(21) Appl. No.: 11/018,026

(22) Filed: Dec. 21, 2004

(65) Prior Publication Data

US 2005/0142920 A1    Jun. 30, 2005

(30) Foreign Application Priority Data

Dec. 26, 2003  (JP)  ............................. 2003-432374
Nov. 12, 2004  (JP)  ............................. 2004-328410

(51) Int. Cl.
*H01R 4/50*   (2006.01)
*H01R 13/625* (2006.01)

(52) U.S. Cl. ...................................... 439/342; 439/259

(58) Field of Classification Search ................ 439/342, 439/259–270
See application file for complete search history.

(56) References Cited

U.S. PATENT DOCUMENTS

| 5,013,256 A | 5/1991 | Matsuoka et al. |
| 5,299,950 A | 4/1994 | Kaneko |
| 5,588,861 A | 12/1996 | Townsend |
| 6,142,810 A | 11/2000 | Hsiao et al. |
| 6,773,290 B2 * | 8/2004 | Lai ............................. 439/342 |
| 2003/0186571 A1 | 10/2003 | Lin |
| 2003/0232529 A1 | 12/2003 | Peng et al. |
| 2004/0009694 A1 * | 1/2004 | Lai ............................. 439/342 |
| 2005/0142920 A1 * | 6/2005 | Hashimoto .................. 439/342 |

FOREIGN PATENT DOCUMENTS

EP    0 453 671 A1    10/1991

* cited by examiner

*Primary Examiner*—James R. Harvey
(74) *Attorney, Agent, or Firm*—Barley Snyder LLC

(57) ABSTRACT

A PGA IC socket, in which socket contacts are arranged at high density, and that performs positioning of an IC package without inhibiting the high density arrangement of the socket contacts. The PGA type IC socket contains a large number of socket contacts for contacting a large number of lead pins of an electrical device; a socket housing, in which a large number of cavities for housing the socket contacts are arranged in a matrix; and a drive portion for moving the lead pins. Each of the socket contacts has a pair of narrowly spaced resilient contact portions for contacting a lead pin. Cutouts, which are open toward the electrical device, are formed in walls of the cavities, such that cavities which are adjacent in the direction perpendicular to the lead pins are in communication with each other.

12 Claims, 10 Drawing Sheets

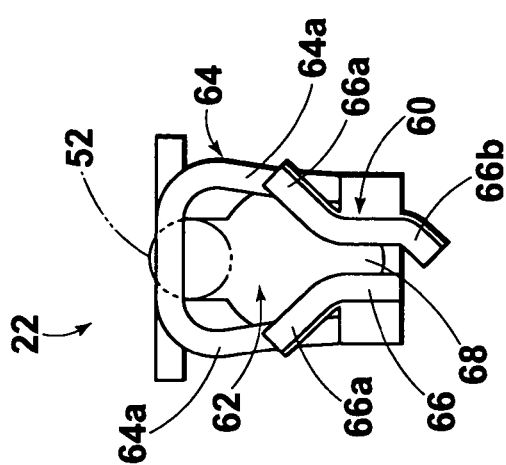
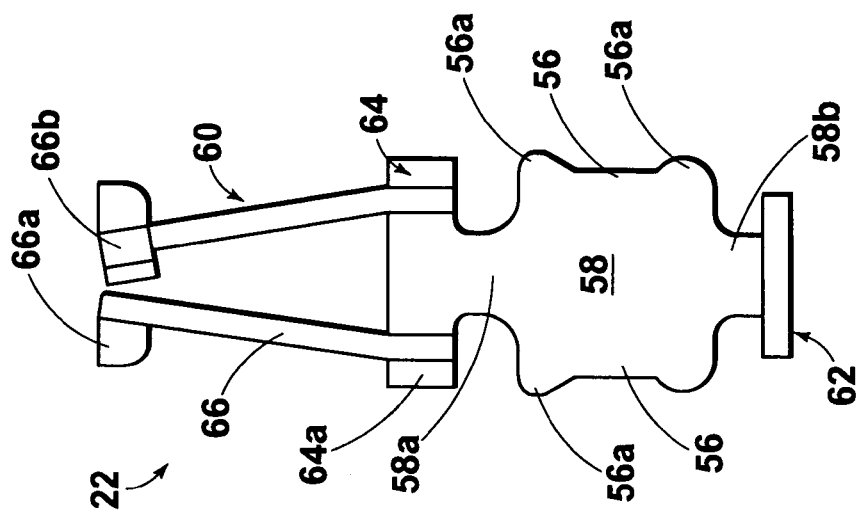
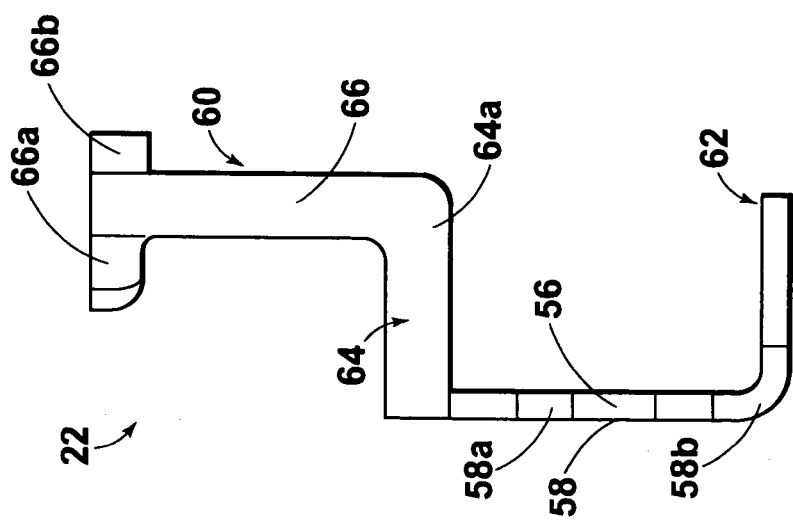

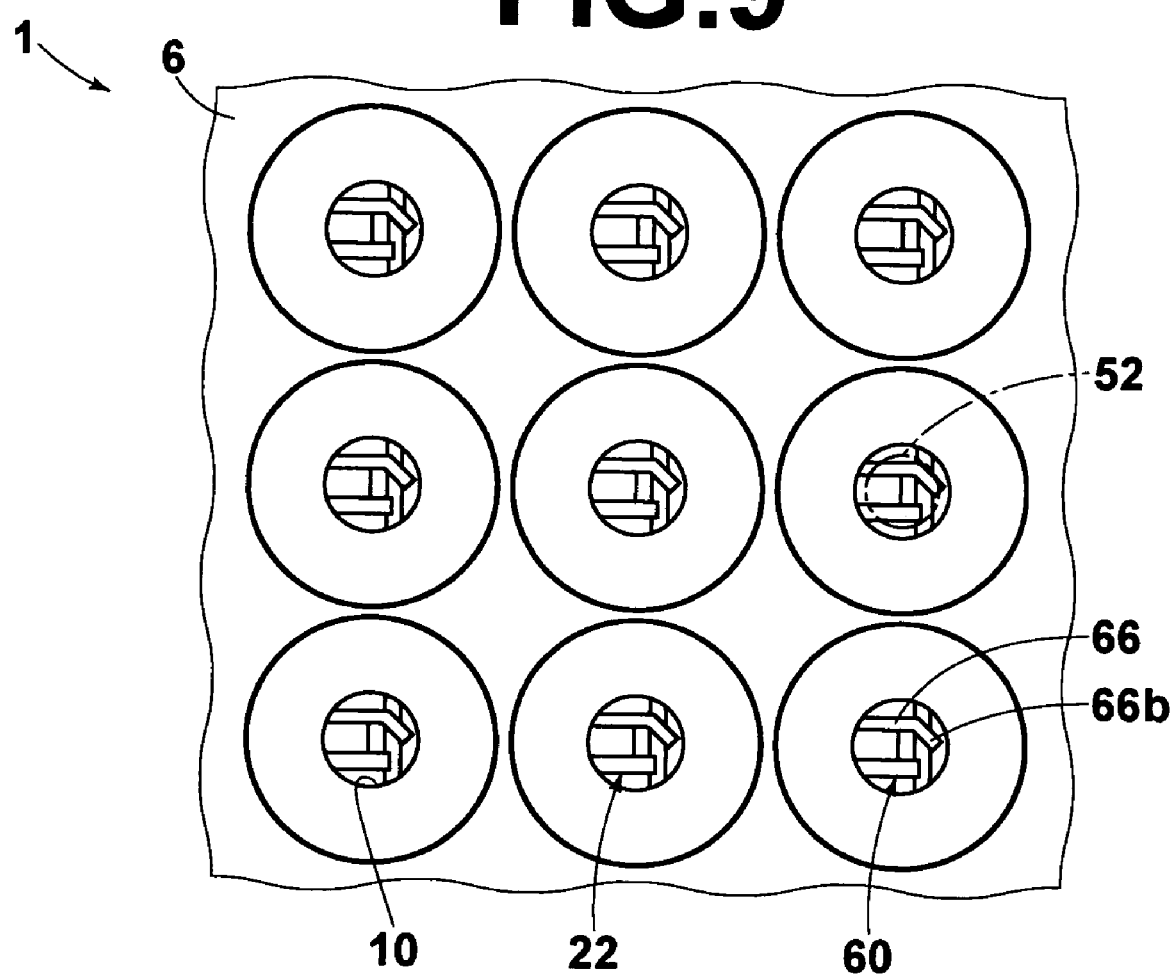

PGA TYPE IC SOCKET

FIELD OF THE INVENTION

The present invention relates to an integrated circuit (IC) socket and more particularly, to a zero or low insertion force Pin Grid Array (PGA) IC socket.

BACKGROUND

A PGA socket is disclosed in U.S. Pat. No. 5,299,950 (FIGS. 1 and 6A). This type of IC socket comprises socket contacts, having pairs of resilient contact portions and a connecting portion, which is formed in a substantially C-shape, for connecting the resilient contact portions. This IC socket further comprises cavities, which are arranged in a two dimensional matrix to house the socket contacts. Lead pins of an IC package are inserted with zero or low insertion force into proximal end portions of the pairs of resilient contact portions, where the gaps therebetween are comparatively wide. Next, the lead pins are moved toward the distal ends of the resilient contact portion pairs, where the gaps therebetween are narrow. Thereby, the lead pins are electrically connected with the socket contacts, and held between the distal ends of the resilient contact portions. In this known PGA type IC socket, housing walls of the cavities, in the proximity of the distal ends of the resilient contact portions, prevent disengagement of the lead pins from the socket contacts, and also position the IC package. Accordingly, the housing walls that form the cavities are indispensable.

In the known IC socket described above, there is a possibility that the lead pins will interfere with the cavity walls during insertion and horizontal movement of the lead pins. Therefore it is necessary to occupy a certain sized space for the cavities. Accordingly it is difficult to achieve high density socket contacts at narrow pitches due to these dimensional constraints.

SUMMARY

The present invention has been developed in view of the above circumstances. It is an object of the present invention to provide a PGA type IC socket, in which it is possible to arrange socket contacts at high density.

It is another object of the present invention to provide a PGA type IC socket, by which IC packages can be positioned, without inhibiting the high density arrangement of socket contacts.

A pin grid array (PGA) integrated circuit (IC) socket according to the invention features a socket housing, having a plurality of socket contacts for contacting lead pins of another electrical device, and a plurality of cavities, which are arranged two dimensionally, for housing each of the socket contacts in the same orientation. A drive portion is provided for moving the lead pins in a direction perpendicular to an insertion direction thereof. A pair of narrowly spaced resilient contact portions contact the lead pins, which have been moved in the perpendicular direction and cutouts are formed in the walls of the cavities toward the other electrical device, such that cavities, which are adjacent to each other in the perpendicular direction, are in communication with each other.

BRIEF DESCRIPTION OF THE DRAWINGS

The invention will now be described with reference to the accompanying figures of which:

FIGS. 3A, 3B, and 3C illustrate a socket contact utilized in the IC socket of FIG. 1, wherein FIG. 3A is a side view, FIG. 3B is a front view, and FIG. 3C is a plan view;

FIG. 9 is a partial plan view, corresponding to FIG. 6, that illustrates the state after the slide cover has been moved;

FIGS. 10A and 10B are partial magnified sectional views of an IC socket according to a second embodiment of the present invention, wherein FIG. 10A illustrates a state prior to a slide cover being moved, and FIG. 10B illustrates a state after the slide cover has been moved;

FIGS. 11A, 11B, and 11C illustrate the socket contact utilized in the IC socket of FIGS. 10A and 10B, wherein FIG. 11A is a side view, FIG. 11B is a front view, and FIG. 11C is a plan view;

FIGS. 12A and 12B are partial magnified sectional views of an IC socket according to a third embodiment of the present invention, wherein FIG. 12A illustrates a state in which a slide cover is in its initial position, and FIG. 10B illustrates a state after the slide cover has been driven and moved to its final position; and, FIGS. 13A, 13B, and 13C illustrate a socket contact, which is utilized in the IC socket of FIGS. 12A and 12B, wherein

DETAILED DESCRIPTION OF THE EMBODIMENT(S)

Figure 1:
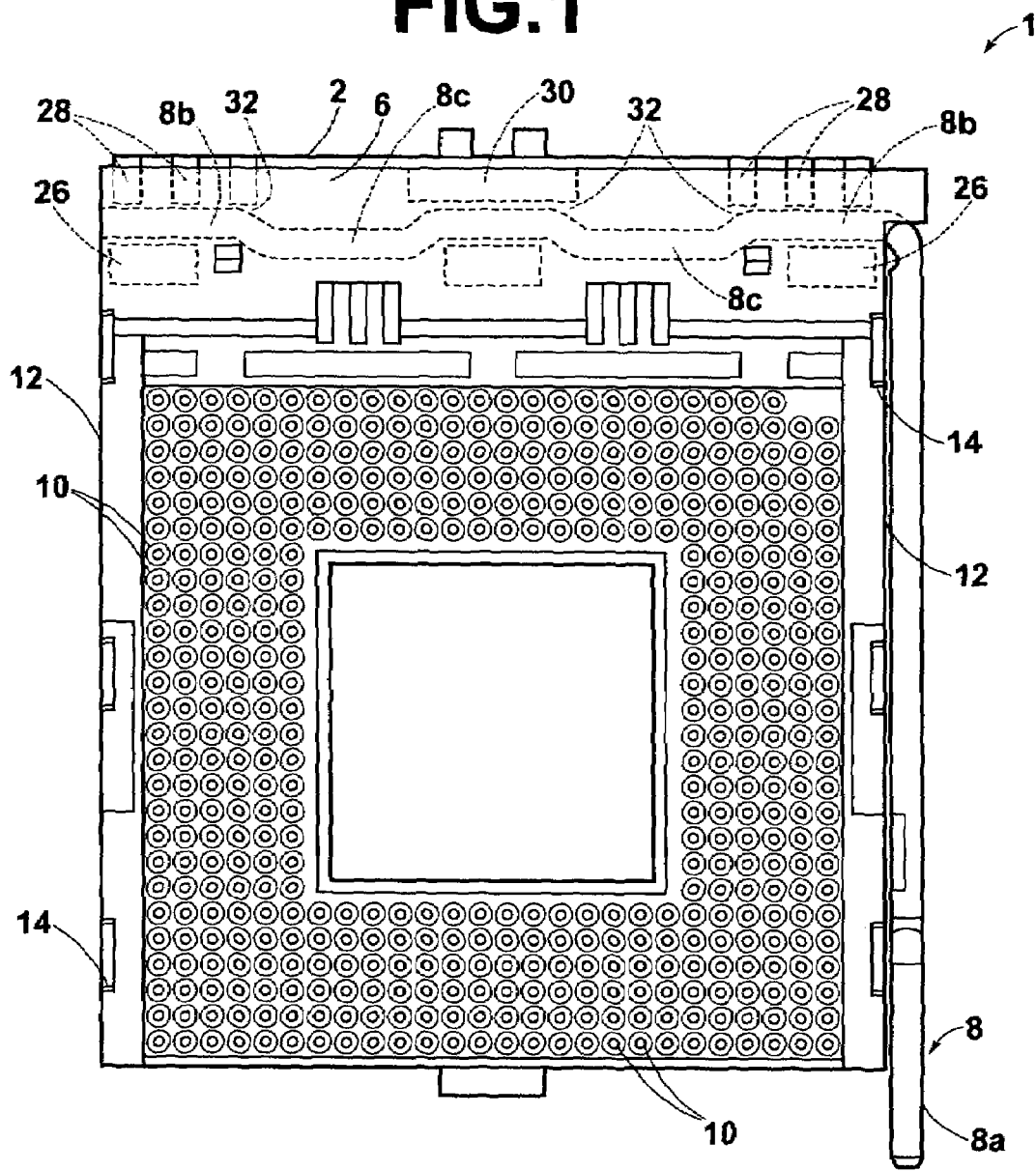
FIG. 1 is a plan view of an IC socket according to a first embodiment of the present invention.
Figure 2:
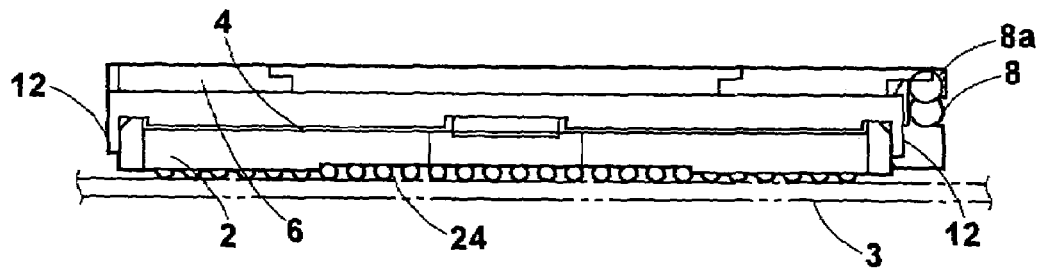
FIG. 2 is a front view of the IC socket of FIG. 1.

A first embodiment of the PGA type IC socket (hereinafter, simply referred to as "IC socket") of the present invention will be described in detail with reference to the attached drawings. Referring to FIGS. 1 and 2, major components of the IC socket 1 include an insulative socket housing 2 and a slide cover 6. The slide cover 6 is placed on the upper surface 4 of the socket housing 2 and configured to slide along the upper surface 4. The IC socket 1 further includes a lever 8, for actuating the slide cover 6. The slide cover 6 has a large number of circular apertures 10 (refer to FIG. 1) passing therethrough and arranged in a matrix. The apertures 10 are formed to receive lead pins 52 (refer to FIG. 4), which are electrical contacts of an electronic device housed in an IC package 50. It should be noted here that the slide cover 6 and the lever 8, for moving the lead pins 52 in a direction perpendicular to their insertion direction, are referred to as a drive portion.

The slide cover 6 comprises side walls 12 that extend along the exterior of the socket housing 2. A plurality of long rectangular holes 14 that extend in the sliding direction of the slide cover 6, are formed in each of the side walls 12. The rectangular holes 14 receive corresponding protrusions (not shown) of the socket housing 2, allowing the slide cover 6 to be mounted so as to be slidable over the socket housing 2.

A large number of socket contacts 22 as shown in FIGS. 3A, 3B, and 3C are located in the socket housing 2 under corresponding apertures 10. Each of the socket contacts 22 has a solder ball 24 (FIG. 4), which is to be soldered to a circuit board 3 (FIG. 1), at the lower edge thereof. A plurality of block shaped protrusions 26, 28, and 30 are integrally formed with the socket housing 2 at the edges of the upper surface 4 thereof. These protrusions 26, 28, and 30 form a lever holding groove 32.

The lever 8 is a rod like metallic member having a circular cross section which is formed into an L shape. An operating portion 8a, formed at a first end, is provided on the side of one of the side walls 12, while a second end is provided in the lever holding groove 32, to serve as a support shaft 8b, about which the lever 8 rotates. Cam shafts 8c, which are partially offset from the support shaft 8b, are integrally formed with the support shaft 8b. When the lever 8 is operated, the cam shafts 8c engage the slide cover 6. The slide cover 6 is driven by the cam shafts 8c to slide with respect to the socket housing 2. This technique is commonly applied; therefore, a detailed description of this structure will be omitted.

Mounting of an IC package 50 is performed as follows. First, the lever 8 is rotated 90 degrees upward from the position illustrated in FIG. 1. Then, the IC package 50 is placed on the slide cover 6 with zero or low insertion force. Thereafter, the lever 8 is rotated back to the position illustrated in FIG. 1, thereby establishing electrical connections between the lead pins 52 (refer to FIG. 4) of the IC package 50 and the socket contacts 22 of the IC socket 1. The electrical connecting structure that employs the lever 8 is well known as an LIF (Low Insertion Force) connector or as a ZIF (Zero Insertion Force) connector; therefore, a detailed description will be omitted.

Next, the socket contacts 22, which are provided within the cavities 54 (FIG. 4) of the socket housing 2, will be described in greater detail with reference to FIGS. 3A, 3B, and 3C. Each of the socket contacts 22 is formed by stamping and forming a metallic plate. The socket contact 22 has a base 58; a resilient contact portion 60, which is formed at the upper part of the base 58; and a leg portion 62, which is formed at the lower part of the base 58, all of which are integrally formed. The base 58 has a pair of engaging protrusions 56a on each of its side edges 56.

The resilient contact portion 60 includes a base end portion 64, which is bent in two directions to extend perpendicular to and horizontally away from the base 58 via a constricted portion 58a; and lead pin contact portions 66 that extend upward from the base end portion 64 and approach each other toward their distal ends. Here, the expressions "up" and "down" are utilized for convenience in the description, and refer to the upward and downward directions in FIGS. 3A and 3B. The base end portion 64 comprises a pair of arms 64a with a gap, which is greater than the diameter of the lead pins 52 (refer to FIG. 4). The arms 64a converge slightly at the free ends thereof.

The lead pin contact portions 66 have a substantially parallel gap 68 therebetween, as illustrated in FIG. 3C. A pair of guide pieces 66a are formed at the distal ends of the lead pin contact portions 66, such that they open toward the base end portion 64. The guide pieces 66a guide the lead pin 52 during movement in the insertion direction, that is, during horizontal movement of the lead pin 52. A stopper 66b is formed on the side of the distal end opposite the guide pieces 66a, on at least one of the resilient contact portions 60. The stopper 66b is inwardly inclined, that is, inclined toward the gap 68. The leg portion 62 is substantially rectangular, as is clear from FIG. 3C. The leg portion 62 is formed so as to be bent, via the constricted portion 58b, perpendicular to the base 58 in the same direction as the base end portion 64.

Figure 4:
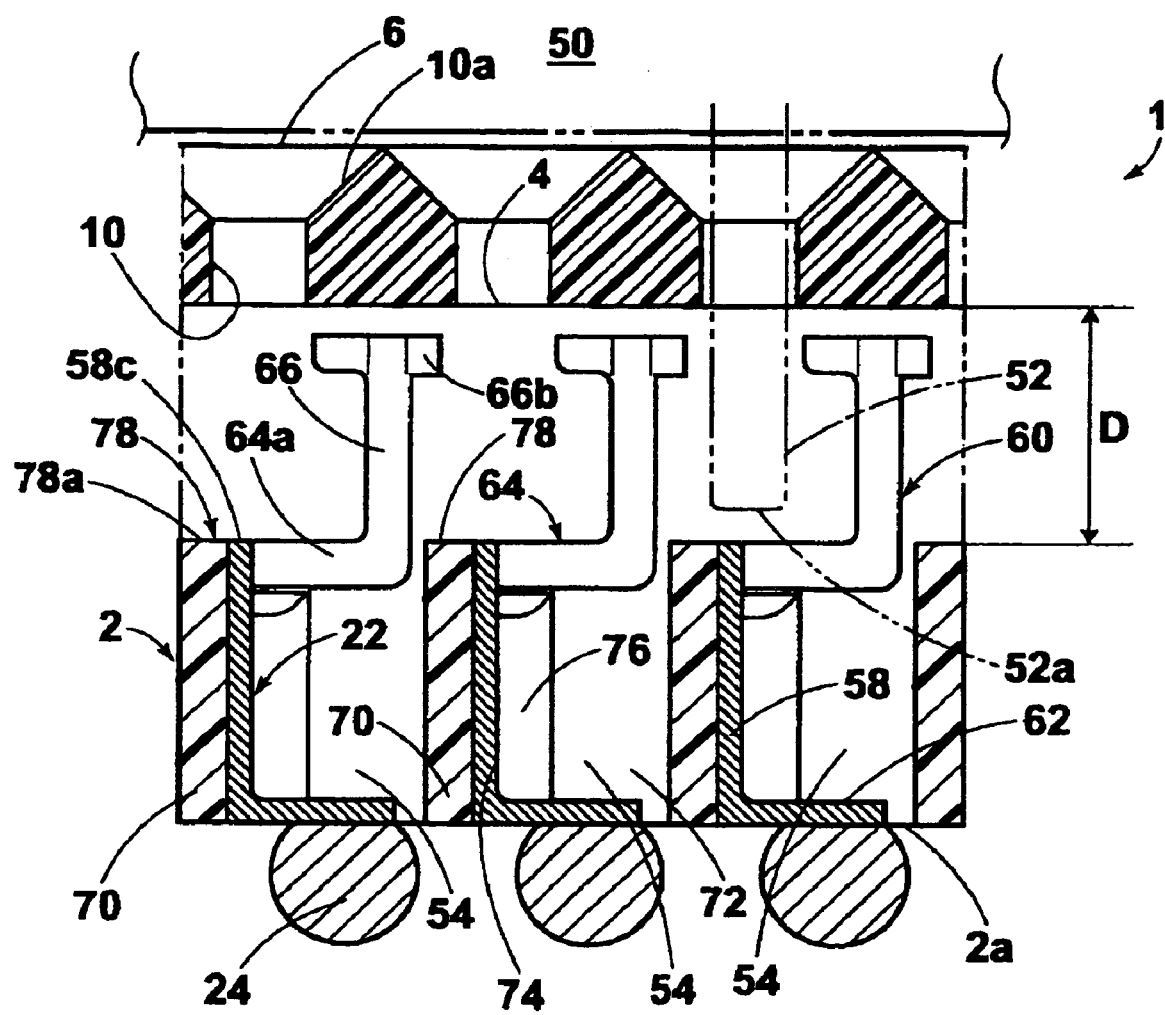
FIG. 4 is a partial magnified sectional view of the IC socket, in which the socket contacts of FIG. 3 are provided.
Figure 5:
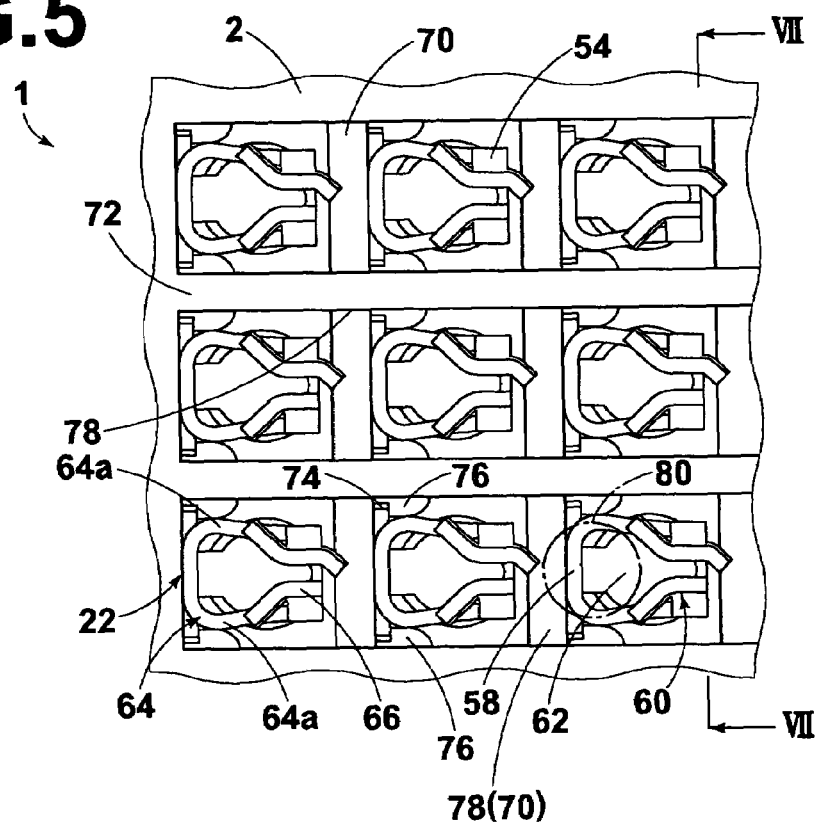
FIG. 5 is a partial sectioned plan view of a socket housing, in which the socket contacts of FIG. 3 are provided.
Figure 6:
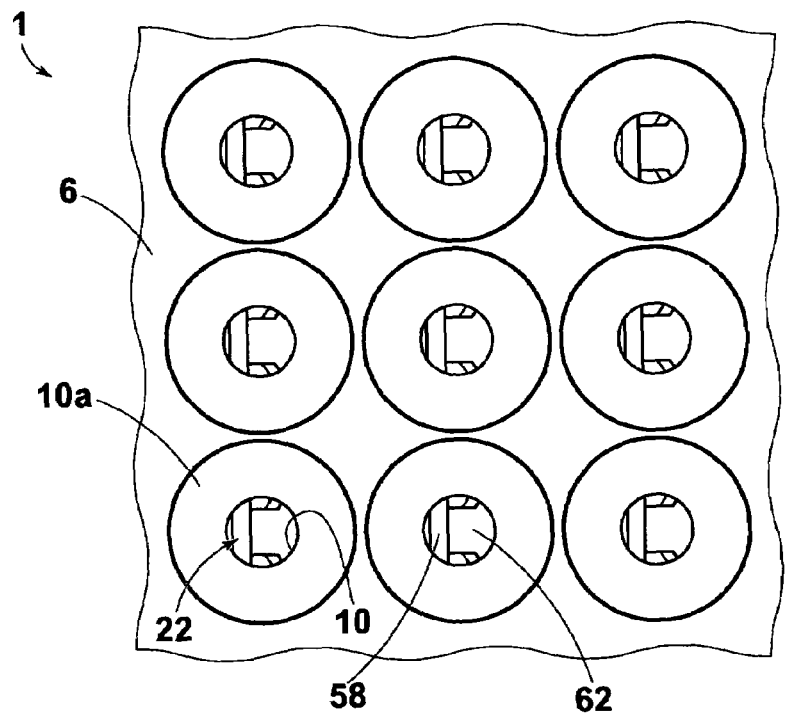
FIG. 6 is a partial plan view similar to that of FIG. 5 showing the IC socket according to the first embodiment.

Next, the state in which the socket contacts 22 are provided in the socket housing 2 will be described with reference to FIGS. 4 through 7. As illustrated in FIG. 4, the cavities 54 are formed in the socket housing 2. The socket contacts 22 are located within the cavities 54. The slide cover 6 is mounted on the upper surface 4 of the socket housing 2.

First, the socket housing 2 will be described in detail. As illustrated in FIG. 4, the cavities 54 pass through the socket housing 2 in the vertical direction. Adjacent cavities 54 are separated by walls 70 and 72. A pair of restricting projections 76 are formed adjacent to each of the walls 70. Contact receiving grooves 74 are formed by the walls 70 and the restricting projections 76. The socket contacts 22 are press fit within the contact receiving grooves 74 from above, and the engaging protrusions 56a (refer to FIG. 3B) engage with the contact receiving grooves 74 to fix the socket contacts 22 therein. At this time, the leg portions 62 are positioned so as to cross the cavities 54 at the lower surface 2a of the socket housing 2. The solder balls 24 are formed on the lower surfaces of the leg portions 62. The resilient contact portions 60 are positioned so that the arms 64a cross the cavities 54, and the lead pin contact portions 66 are positioned toward another adjacent wall 70.

What is important here is that cutouts 78, which are open toward the IC package 50, are formed in the walls 70 of the cavities 54. The cutouts 78 are in the movement paths of the lead pins 52. The plurality of cavities 54 communicate with each other via the cutouts 78. The dimensions of the cutouts 78, that is, the depth D (refer to FIG. 4) from the upper surface 4 of the socket housing 2 to the lower edges (inner edges) 78a of the cutouts 78, is approximately ½ the thickness of the socket housing 2 in the vertical direction. The cutouts 78 are deep enough to reach the upper edges 58c (refer to FIG. 4) of the bases 58 of the socket contacts 22. The stoppers 66b of the resilient contact portions 60 are positioned within the cutout 78 of another adjacent wall 70.

Figure 7:
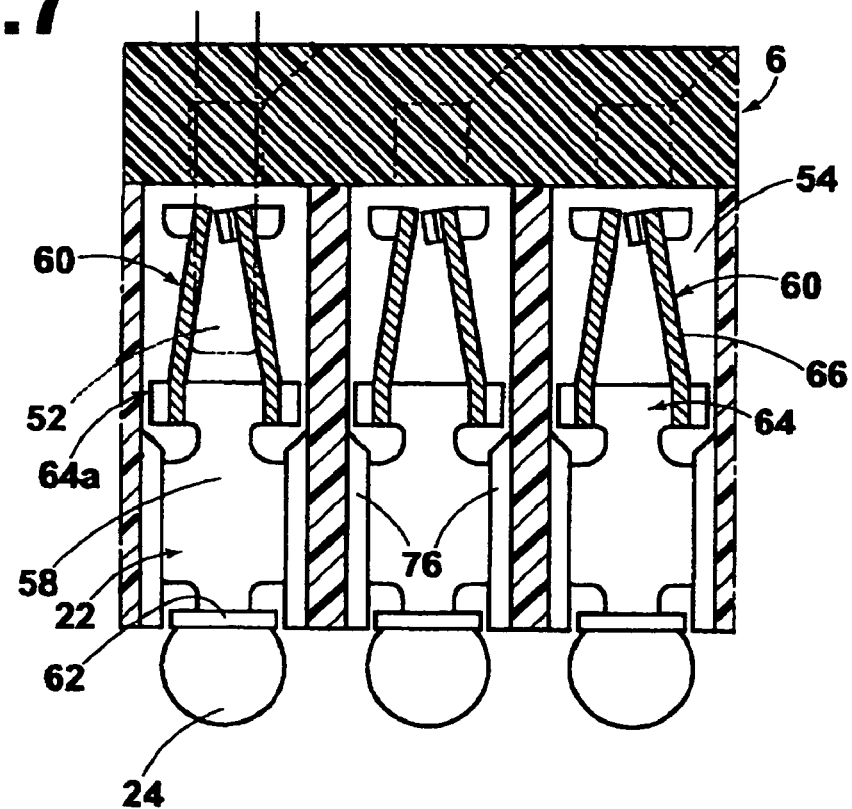
FIG. 7 is a partial magnified sectional view taken along line VII—VII of FIG. 5, with the addition of a slide cover.

The resilient contact portions 60 of the socket contacts 22 have the following configuration with respect to the socket housing 2. Each of the resilient contact portions 60 includes the base 58, which is held in the cavity 54 and has its upper edge 58c at substantially the same position as the inner edge 78a of the cutout 78; the base end portion 64 that extends horizontally from the upper edge of the base 58; and the lead pin contact portions 66, which are formed to extend upward from the base end portion and which are inclined such that they approach each other toward their distal ends. Because of this configuration, the lead pins 52 do not contact the socket contacts 22 during insertion into the socket housing 2. Therefore, insertion can be accomplished with zero insertion force. The slide cover 6 illustrated in FIG. 4 is in its initial position, that is, the position prior to sliding movement thereof. The apertures 10 are positioned substantially above the bases 58 of the socket contacts 22. Tapers 10a, for guiding the lead pins 52, are formed at the peripheries of the apertures 10. When a lead pin 52 is inserted through the aperture 10, as illustrated by broken lines, the wall 70 does not interfere therewith, as the cutout 78 is formed in the movement path of the lead pin 52. In addition, the lead pin 52 does not abut the lower edges 78a of the cutout 78, because the distal end 52a thereof does not reach the depth D of the cutout 78. Further, the lead pin 52 is positioned between the pair of resilient contact portions 60, as illustrated in FIG. 7. Note that the region 80, illustrated by the broken line in FIG. 5, indicates the region at which the lead pin 52 is inserted, and partially overlaps the wall 70. It can be seen from this also that the cutout 78 operates effectively during insertion of the lead pin 52.

Figure 8:
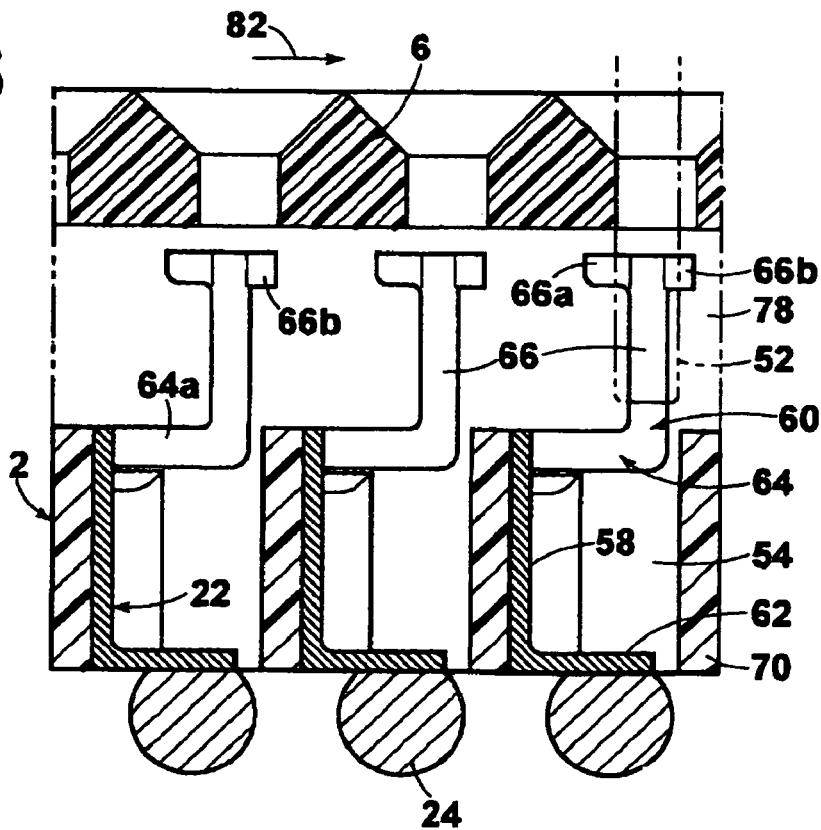
FIG. 8 is a partial magnified sectional view, corresponding to FIG. 4, that illustrates the state after the slide cover has been moved.

Next, the state in which the slide cover 6 has been moved will be described with reference to FIG. 8 and FIG. 9. When the slide cover 6 completes its movement in the direction of arrow 82, the lead pins 52 are guided by the guide pieces 66a, to move between the pair of resilient contact portions 60. The lead pins 52 contact the lead pin contact portions 66, and are held therebetween. At this time, the cutouts 78 prevent interference between the lead pins 52 and the walls 70. In addition, the stoppers 66b prevent further movement of the lead pins 52 in the direction of arrow 82, thereby preventing disengagement of the lead pins 52 from the resilient contact portions 60. In FIG. 9, the lead pin 52 is illustrated by broken lines, and the lead pin contact portions 66 are shown in their closed state, prior to contact with the lead pin 52. It can be clearly seen from FIG. 9 that when the lead pin 52 is held by the lead pin contact portions 66, the stopper 66b prevents disengagement of the lead pin 52.

Next, an IC socket 100, according to a second embodiment of the present invention, will be described with reference to FIGS. 10A and 10B. The main difference between the IC socket 1 of the first embodiment and the IC socket 100 of the second embodiment is in the shape of the socket contacts 122. That is, the socket contacts 122 do not have parts that correspond to the stoppers 66b of the first embodiment. In other words, the IC socket 100 of the second embodiment is not provided with a positioning means for the lead pins 52 nor for the IC package 50.

Figure 11A:
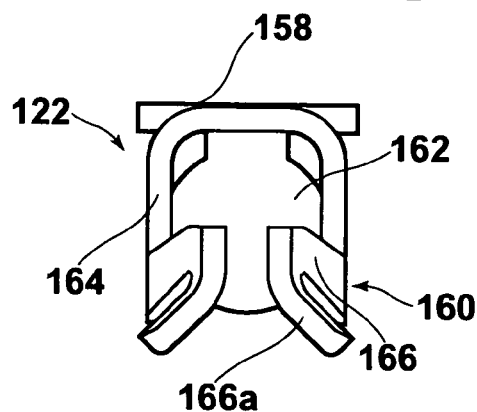
Figure 11B:
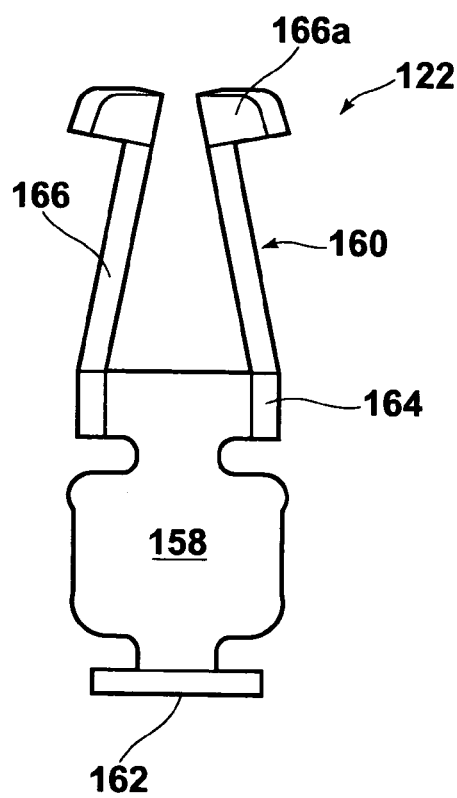
Figure 11C:
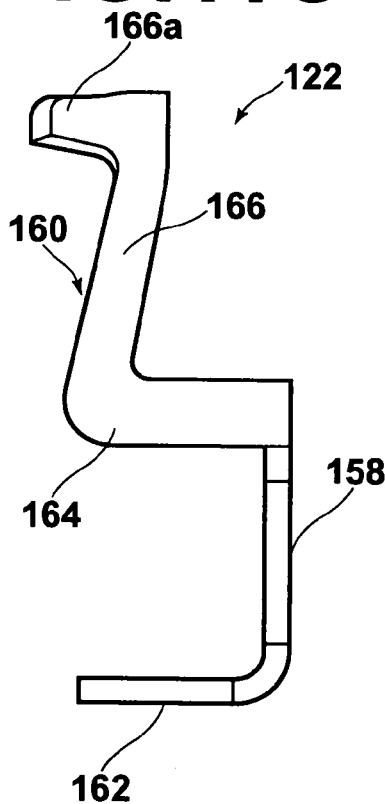

First, the socket contacts 122 will be described with reference to FIGS. 11A, 11B, and 11C. FIGS. 11A, 11B, and 11C illustrate the socket contact 122 utilized in the IC socket 100 according to the second embodiment, wherein FIG. 11A is a side view, FIG. 11B is a front view, and FIG. 11C is a plan view. Note that the following description will be based mainly on the differences between the socket contacts 22 of the first embodiment and the socket contacts 122 of the present embodiment. Each of the socket contacts 122 includes a base 158; a leg portion 162 at the lower portion of the base 158; and a pair of resilient contact portions 160 at the upper portion of the base 158. Each of the resilient contact portions 160 includes a base end portion 164 that extends in the same direction as the leg portion 162; and a lead pin contact portion 166 that extends upwardly while being slightly inclined. The lead pin contact portions 166 have spread open guide pieces 166a, for guiding a lead pin 52, at the distal ends thereof. However, no part that corresponds to the stopper 66b is formed on the resilient contact portion 160 at the interior of the guide pieces 166a, that is, toward the side of the substantially parallel lead pin contact portions 166.

Figure 10A:
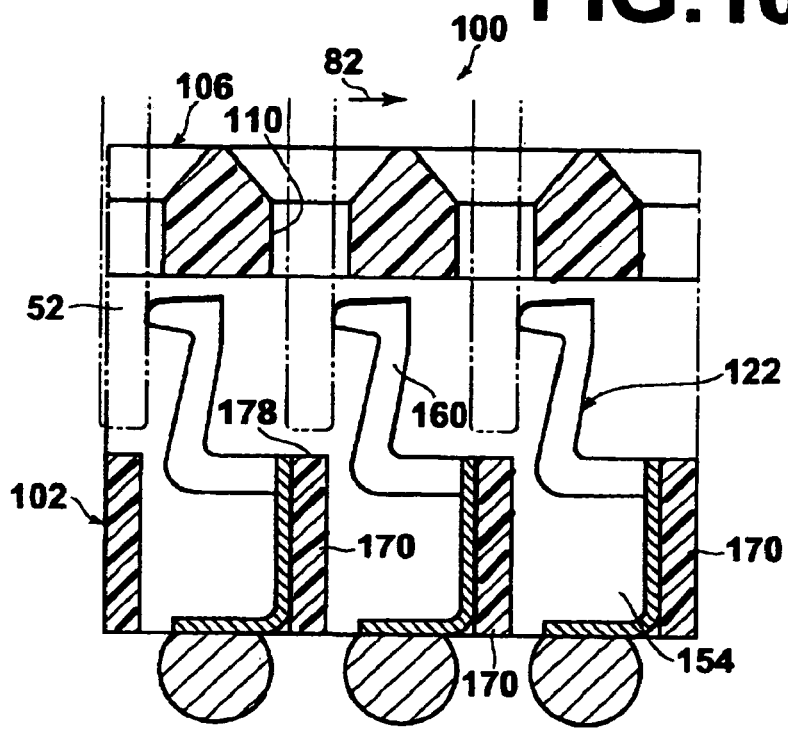

The slide cover 106 is placed atop a socket housing 102, in which the socket contacts 122 configured as described above are provided within cavities 154, as illustrated in FIG. 10A. In FIG. 10A, the slide cover 106 is in its initial position prior to being driven. At this time, apertures 110 of the slide cover 106, for the lead pins 52 to be inserted through, are positioned so as to face walls 170. When the lead pins 52 are inserted through the apertures 110, the lead pins 52 are inserted within cutouts 178, which are formed in the walls 170 between the cavities 154. The cutouts 178 may be of a shape in which corresponding portions of the walls 170 are completely removed. Alternatively, the cutouts 178 may be slot-like cutouts having dimensions so as to not interfere with the lead pins 52. That is, portions of the walls 170 that do not interfere with the lead pins 52 may remain on either side of the movement paths of the lead pins 52.

Figure 10B:
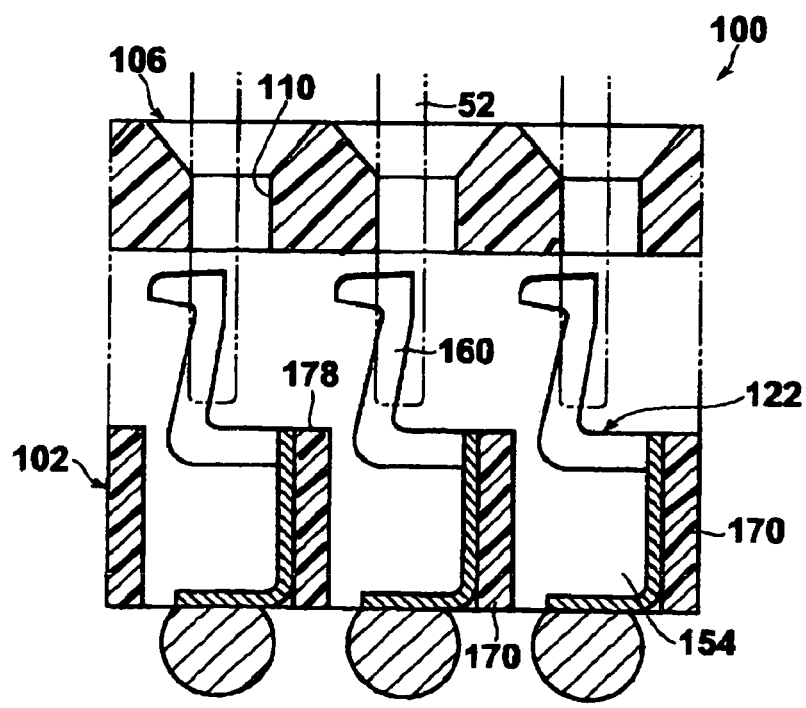

Next, when the slide cover 106 is moved in the direction indicated by arrow 82, the lead pins 52 are moved to the positions illustrated in FIG. 10B. At this time, the lead pins 52 are in contact with the resilient contact portions 160, and do not disengage therefrom. The second embodiment, which has no stopper function, is suited for cases in which the number of socket contacts is small and the distance between adjacent socket contacts is large, or for cases in which the drive system is solid and the relative positioning between the socket housing 102 and the slide cover 106 is accurate. The "cases in which the drive system is solid" refer to cases, for example, in which the slide cover 106 is formed by overmolding resin on a metal plate having a great number of apertures arranged in a matrix therethrough. In the case that this type of construction is adopted, the slide cover 106 has rigidity and exhibits little compression deformation; therefore, positioning accuracy is good.

Next, an IC socket 200 according to a third embodiment of the present invention will be described with reference to FIGS. 12A, 12B, 13A, 13B, and 13C. The characteristic features of the IC socket 200 are that socket contacts 222 have stoppers 266b, and that a socket housing 202 has stopper walls 284.

Figure 13A:
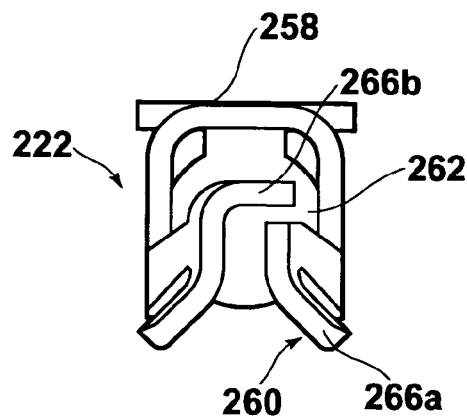
FIG. 13A is a plan view.
Figure 13B:
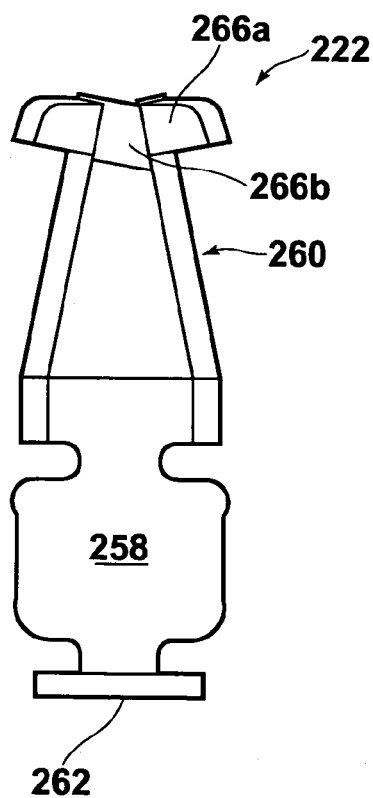
FIG. 13B is a front view.
Figure 13C:
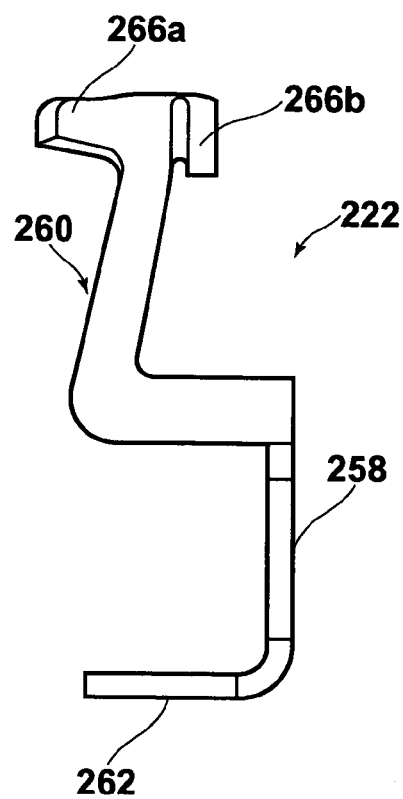
FIG. 13C is a side view.

FIGS. 13A, 13B, and 13C illustrate the socket contact 222, which is utilized in the IC socket 200. The socket contact 222 is similar to the socket contact 122 of the second embodiment, and includes a base 258; a leg portion 262; and resilient contact portions 260. Spread open guide pieces 266a are formed at the distal ends of the resilient contact portions in a manner similar to the second embodiment. Further, a stopper 266b is formed in the interior side of one of the guide pieces 266a so as to cross the gap between the resilient contact portions 260.

Figure 12A:
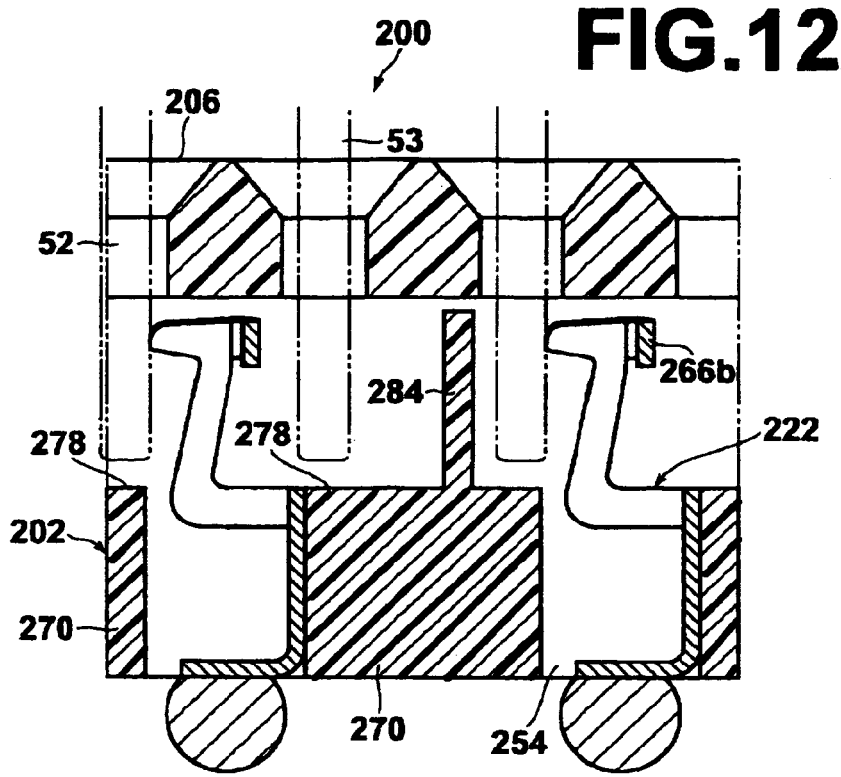

The socket contacts 222, which are configured as described above, are provided in the socket housing 202 as illustrated in FIG. 12A. The stopper wall 284, for preventing movement of a lead pin 53, is provided on the upper surface of a wall 270 between cavities 254. The lead pin 53 is a lead pin, from among the lead pins of the IC package 50, which is not employed to establish electrical connections, and which is unavoidably formed in the IC package 50. The lead pin 53 cooperates with the stopper wall 284 of the socket housing 202, to perform positioning. In the initial state of the slide cover 206 illustrated in FIG. 12A, the lead pins 52 are positioned within cutouts 278, which are formed in the walls 270.

Figure 12B:
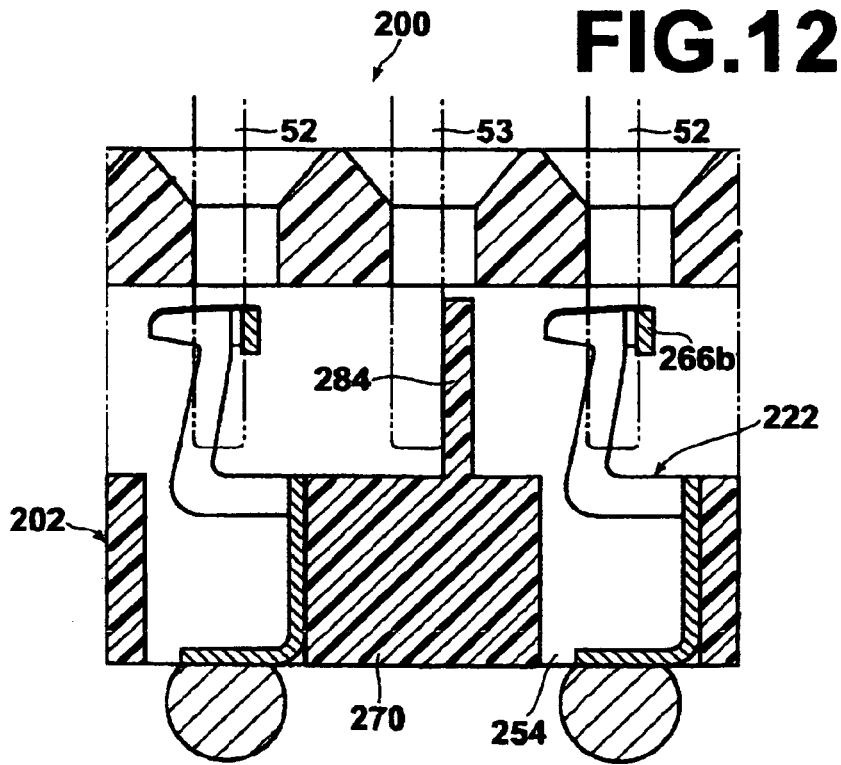

At the final position, to which the slide cover 206 is driven and moved to from its initial position, the lead pins 52 and the socket contacts 222 are in the relationship illustrated in FIG. 12B. In this final position, the lead pins are prevented from further movement by the stoppers 266b of the socket contacts 222. In addition, the lead pin 53, which is not utilized to establish electrical contact, abuts the stopper wall 284 and is prevented from further movement thereby. A desired number of the stopper walls 284 may be provided; therefore, there is no possibility that high density arrangement of the socket contacts 222 will be prevented. Note that the protrusion heights of the stopper walls 284 may be an arbitrary height that interferes with the lead pin 53.

The embodiments of the present invention have been described in detail above. However, the present invention is not limited to the embodiments described above. For example, in the third embodiment illustrated in FIGS. 13A, 13B, and 13C, the stopper 266b of the socket contact 222 and the stopper wall 284 both function as stoppers. However, socket contacts not having the stopper function may be employed, and movement of the lead pin 53 may be prevented by the stopper wall 284, to perform positioning. In this case, if there is a large number of lead pins 53, the cooperation among the lead pins 53 and the stopper walls 284 can secure a sufficient stopper function. However, it is preferable to employ socket contacts 222, which have stopper functions, in the case that the number of lead pins 53 is small. In addition, the arrangement of the apertures of the slide cover and the cavities of the socket housing are not limited to a matrix. They may be arranged in any two dimensional pattern, such as a staggered pattern.

What is claimed is:

1. A pin grid array (PGA) integrated circuit (IC) socket, comprising:
    a socket housing; having a plurality of socket contacts for contacting lead pins of another electrical device and a plurality of cavities, which are arranged two dimensionally, for housing each of the socket contacts in the same orientation;
    a drive portion, for moving the lead pins in a direction perpendicular to an insertion direction thereof;
    a pair of narrowly spaced resilient contact portions for contacting the lead pins, which have been moved in the perpendicular direction; and
    cutouts formed in the walls of the cavities toward the other electrical device, such that cavities, which are adjacent to each other in the perpendicular direction, are in communication with each other.

2. The PGA IC socket as defined in claim 1, further comprising a stopper, for preventing disengagement of the lead pins in the perpendicular direction, formed at a distal end of at least one of the pair of resilient contact portions.

3. The PGA IC socket as defined in claim 1, further comprising stopper walls, for abutting lead pins which are not involved in the electrical contact with the socket contacts.

4. The PGA IC socket as defined in claim 1, wherein the dimensions of the cutouts in the insertion direction of the lead pins are greater than the insertion depth of the lead pins.

5. The PGA IC socket as defined in claim 2, further comprising stopper walls, for abutting lead pins which are not involved in the electrical contact with the socket contacts.

6. The PGA IC socket as defined in claim 2, wherein the dimensions of the cutouts in the insertion direction of the lead pins are greater than the insertion depth of the lead pins.

7. The PGA IC socket as defined in claim 3, wherein the dimensions of the cutouts in the insertion direction of the lead pins are greater than the insertion depth of the lead pins.

8. An integrated circuit (IC) socket, comprising:
    a socket housing having a plurality of cavities defined by walls;
    cutouts formed in the walls, such that adjacent cavities, are in communication with each other;
    a drive portion associated with the socket housing; and,
    a plurality of socket contacts, each of the socket contacts having a pair of narrowly spaced resilient contact portions being disposed in respective ones of the plurality of cavities.

9. The IC socket as defined in claim 8, further comprising a stopper formed at a distal end of at least one of the pair of resilient contact portions.

10. The IC socket as defined in claim 8 wherein the socket housing further comprises stopper walls extending from the walls.

11. The IC socket as defined in claim 9, further comprising stopper walls extending from the walls.

12. The IC socket as defined in claim 9, wherein the dimensions of the cutouts in the insertion direction are greater than the insertion depth of lead pins to be inserted therein.

* * * * *